(12) United States Patent
Yoshida et al.

(10) Patent No.: US 6,678,290 B2
(45) Date of Patent: Jan. 13, 2004

(54) OPTICAL OUTPUT CONTROL CIRCUIT FOR OBTAINING STABLE OPTICAL OUTPUT POWER

(75) Inventors: Takeshi Yoshida, Hiroshima (JP); Masaki Hirose, Kanagawa (JP); Takeshi Inagaki, Tokyo (JP); Katsuhito Toyoda, Tokyo (JP)

(73) Assignee: NTT Electronics Corporation, Tokyo (JP)

( * ) Notice: Subject to any disclaimer, the term of this patent is extended or adjusted under 35 U.S.C. 154(b) by 0 days.

(21) Appl. No.: 10/095,117

(22) Filed: Mar. 12, 2002

(65) Prior Publication Data

US 2002/0162953 A1 Nov. 7, 2002

(30) Foreign Application Priority Data

Mar. 16, 2001 (JP) ........................................ 2001-077172

(51) Int. Cl.[7] ............................ H01S 3/13; H01S 3/00
(52) U.S. Cl. ........................ 372/29.021; 372/29.014; 372/38.02; 372/38.07
(58) Field of Search ................... 372/29.021, 29.014, 372/38.02, 38.07

(56) References Cited

U.S. PATENT DOCUMENTS

| | | | | |
|---|---|---|---|---|
| 6,097,746 A | * | 8/2000 | Noda et al. | 372/38 |
| 6,185,233 B1 | * | 2/2001 | Moothart et al. | 372/32 |
| 6,212,210 B1 | * | 4/2001 | Serizawa | 372/32 |
| 6,229,832 B1 | * | 5/2001 | Baba et al. | 372/38.01 |
| 6,282,216 B1 | * | 8/2001 | Ikeuchi et al. | 372/29.015 |
| 6,389,046 B1 | * | 5/2002 | Stayt, Jr. et al. | 372/29.02 |
| 6,392,215 B1 | * | 5/2002 | Baumgartner et al. | 250/205 |
| 6,408,013 B1 | * | 6/2002 | Akagi et al. | 372/29.021 |
| 6,496,525 B1 | * | 12/2002 | Kimura | 372/38.02 |

\* cited by examiner

Primary Examiner—Paul Ip
Assistant Examiner—Davienne Monbleau
(74) Attorney, Agent, or Firm—Rothwell, Figg, Ernst & Manbeck

(57) ABSTRACT

According to the present invention, an optical output automatic control circuit includes an optical output cutoff control circuit outside its feedback loop, and sets an optical output setting voltage at the ground level to prevent overshoot of the optical output while an optical output cutoff signal is being input.

16 Claims, 9 Drawing Sheets

OPTICAL OUTPUT CONTROL CIRCUIT FOR OBTAINING STABLE OPTICAL OUTPUT POWER

BACKGROUND OF THE INVENTION

1. Field of the Invention

The present invention relates to a configuration of an optical output control circuit or an automatic power control circuit suitable for use with an optical transmitter, etc. in an optical communications system.

2. Background Art

FIG. 8 shows a conventional general optical output control circuit or automatic power control circuit (hereinafter referred to as an APC circuit as necessary). The APC circuit comprises: an LD module including a laser diode LD and a monitor photodiode PD; a current-to-voltage conversion circuit 2 (APC-IV conversion circuit) for converting the output current of the monitor photodiode PD into a voltage level; an optical output power control circuit 4 for performing control so as to eliminate the difference between the output voltage V2 (feedback voltage) of the current-to-voltage conversion circuit 2 and the LD optical output power setting voltage V1 output from an optical output power setting input circuit 12; a low-pass filter 6 (LBW-LPF) for deciding the loop band width of the APC circuit; an LD drive circuit 8 (LD-Drv circuit) for controlling the drive current of the laser diode LD; an LD drive setting input circuit 18 (LD-Drv setting input circuit) for deciding the LD drive setting input; low-pass filters 16 and 22 (APC-LPF and ACC-LPF respectively) connected so that the input voltages to the optical output power control circuit 4 and the LD drive circuit 8 change slowly.

Though not shown, the LD drive circuit 8 comprises a circuit for driving the bias current of the laser diode LD and a circuit for driving the modulation current of the laser diode LD. Furthermore, the LD module comprises a thermistor and a thermal electric cooler (TEC) made up of a thermoelectric conversion element. The temperature of the LD is kept constant by an automatic temperature control circuit (ATC circuit) not shown.

The APC circuit detects the backlight, etc. of the laser diode LD by use of the monitor photodiode PD, feeds back the detected optical output power to itself to control the drive current of the laser diode LD, and thereby controls the optical output power of the laser diode LD so as to keep it constant. The operation of the APC circuit will be described in detail. The optical output power of the laser diode LD is determined by detecting the backlight, etc. of the laser diode LD by use of the monitor photodiode PD. The monitor photodiode PD outputs an optical current corresponding to the optical output power of the laser diode LD, and the output optical current is converted into voltage information by the current-to-voltage conversion circuit 2. The voltage information is fed back to the optical output power control circuit 4.

The optical output power control circuit 4 detects and amplifies the difference between the LD optical output power setting voltage VI and the feedback voltage V2 and inputs it to the LD drive circuit 8. The LD drive circuit 8 for driving the modulation current of the laser diode LD controls the LD drive current based on the input voltage from the optical output power control circuit 4, keeping the LD optical output power constant. Furthermore, the low-pass filter 6 (LBW-LPF) is inserted in the APC feedback loop to remove high-frequency signals included in the optical current of the monitor photodiode PD, thereby cutting off signals (noise) at high frequencies.

It should be noted that the APC circuit may include an optical output cutoff circuit 10 for cutting off the optical output of the laser diode LD according to external optical output cutoff signal input. In this case, it is possible to cut off the optical output of the laser diode LD by inputting an external optical output cutoff signal to the optical output cutoff control circuit 10 during the time when the circuit operation is unstable after power-on or even in the ordinary operation in which the optical output power of the laser diode LD is normally controlled so as to be kept constant. Then, when the optical output cutoff signal input has been removed, the APC circuit is restored to the normal operation and therefore the optical output power of the laser diode LD is controlled so as to be kept constant.

It should be further noted that the APC circuit may include the low-pass filter 16 (APC-LPF) between the optical output power setting input circuit 12 and the optical output power control circuit 4, and the low-pass filter 22 (ACC-LPF) between the LD drive setting input circuit 18 and the LD drive circuit 8. In this case, the output voltages of the optical output power setting input circuit 12 and the LD drive setting input circuit 18 slowly increase after they are passed through the low-pass filter 16 (APC-LPF) and the low-pass filter 22 (ACC-LPF), respectively, according to their time constants. Therefore, the ordinary operation of the APC circuit can be started when the APC circuit has assumed its stable operational state after power-on. Furthermore, since the setting voltages determined based on the time constants of the low-pass filters 16 and 22 are input to the APC circuit, overshoot of the optical output does not occur.

However, in an APC circuit having the optical output cutoff function described above, an overshoot case occurs in which the optical output power of the laser diode LD exceeds its set value in transient response when the optical output cutoff input has been removed.

FIG. 9 is a signal waveform diagram used to describe the operation of the APC circuit shown in FIG. 8. Specifically, this diagram shows the optical output power obtained when the optical output cutoff signal is input or removed while the APC circuit is controlling the LD optical output power so as to keep it constant. Referring to FIGS. 8 and 9, reference numeral V1 denotes an LD optical output power setting voltage, while reference numeral V2 denotes the feedback voltage from the current-to-voltage conversion circuit 2. If the High level is input as the optical output cutoff signal, the optical output cutoff control circuit 10 performs control such that the drive current of the laser diode LD is reduced to 0 mA.

If an optical output cutoff signal having a high-speed pulse waveform is input as shown in FIG. 9, the feedback voltage V2 is reduced to 0 V because the optical output of the laser diode LD is cut off. At that time, since the LD optical output power setting voltage V1 continues to be input to the optical output power control circuit 4, the output voltage of the optical output power control circuit 4 is at its maximum. Therefore, when the optical output cutoff signal input has been removed and thereby the optical output cutoff control circuit 10 performs control such that the drive current of the laser diode LD can be driven, the output of the optical output power control circuit 4 is in excess until the feedback loop of the APC responds, generating overshoot as shown in FIG. 9. Overshoot of the optical output causes destruction of the LD.

SUMMARY OF THE INVENTION

Accordingly, an object of the present invention is to provide an optical output control circuit or an APC circuit capable of reducing overshoot of the optical output power of a light emitting device such as a laser diode (LD) when the optical output is cut off or the cutoff of the optical output is cancelled.

According to one aspect of the present invention, an optical output control circuit comprises a light emitting device. A drive circuit will output a drive signal to the light-emitting device so that the light emitting device emits light. A drive setting input circuit will output to the drive circuit a drive setting signal to keep the light emitting device in a constant state. An input circuit for optical output power setting will outputs an optical output power setting signal to set optical output power of the light-emitting device. A monitor circuit will monitor the optical output power of the light emitting device, and will output a monitor signal. A control circuit for optical output power will compare the optical output power setting signal with the monitor signal, and will input a comparison signal to the drive circuit to control the drive signal of the drive circuit. A first control circuit for optical output cutoff will receive an optical output cutoff signal for cutting off optical output of the light emitting device, and will stop the drive circuit from outputting the drive signal while the optical output cutoff signal is being input. A second control circuit for optical output cutoff will receive the optical output cutoff signal, and will change the optical output power setting signal, being input to the optical output power control circuit, to an optical output cutoff level while the optical output cutoff signal is being input. Thus, the optical output power of the light emitting device is controlled.

In another aspect of the present invention, in the optical output control circuit, preferably a third control circuit for optical output cutoff will receive the optical output cutoff signal, and will change the drive setting signal, being input to said drive circuit, to a level to reset an operation state of the light emitting device while the optical output cutoff signal is being input.

In another aspect, in the modification of the optical output control circuit, the first control circuit for optical output cutoff may not be included. In addition, the second control circuit for optical output cutoff may not be included further.

Other features and advantages of the invention will be apparent from the following description taken in connection with the accompanying drawings.

DESCRIPTION OF THE PREFERRED EMBODIMENTS

Preferred embodiments of the present invention will be described below with reference to the accompanying drawings. In the figures, the same or corresponding components may be denoted by like numerals to simplify or omit their explanation.

First Embodiment

Figure 1:
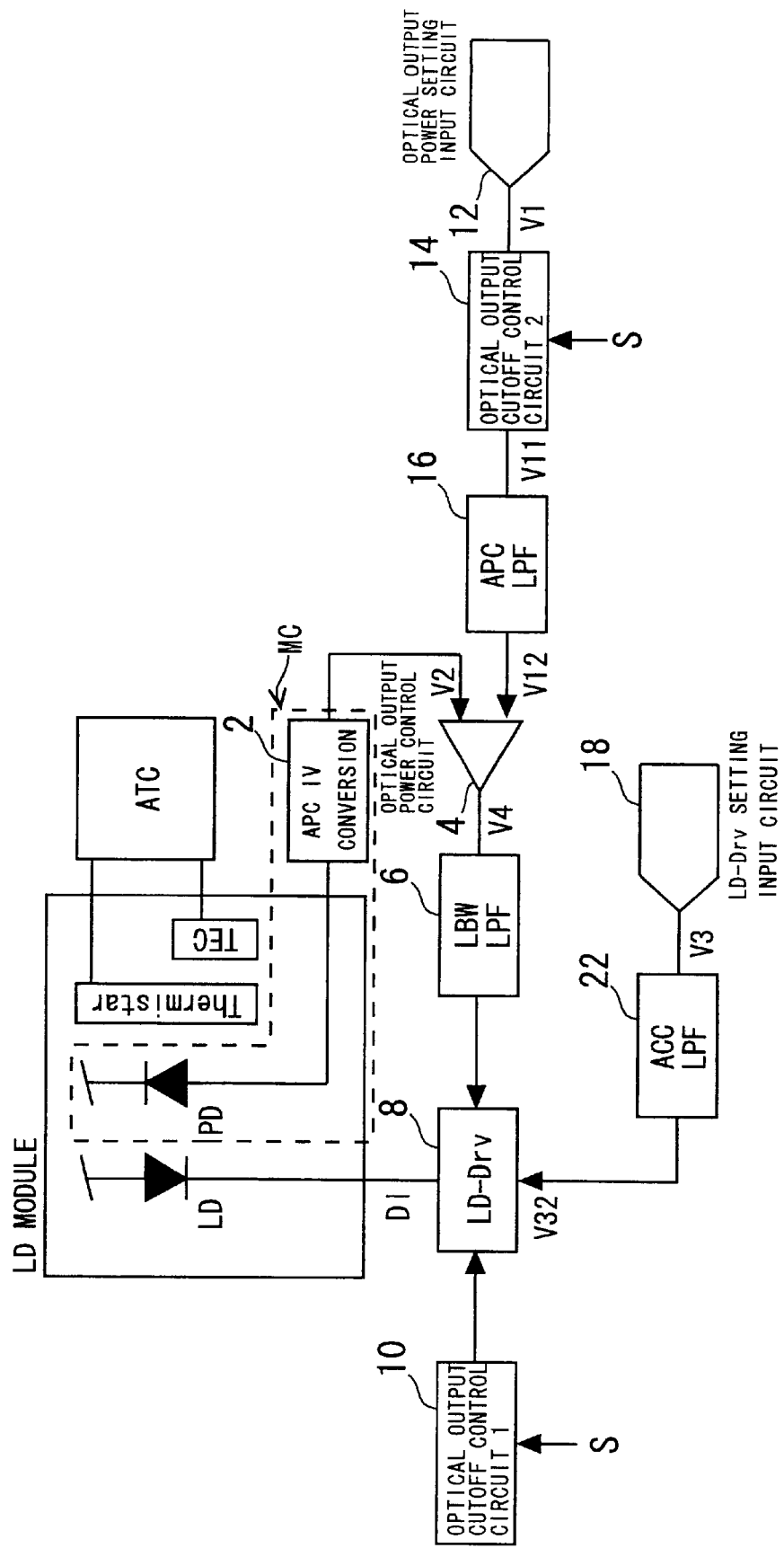
FIG. 1 is a block diagram showing the configuration of an optical output control circuit or an automatic power control circuit (APC circuit) according to a first embodiment of the present invention.

FIG. 1 is a block diagram showing the configuration of an optical output control circuit or an automatic power control circuit (APC circuit) according to a first embodiment of the present invention.

The APC circuit comprises: an LD module including a laser diode LD (a light emitting device, abbreviated as LD as necessary in the text and indicated by reference numeral LD in the figures) and a monitor photodiode PD (indicated by reference numeral PD in the figures); a current-to-voltage conversion circuit 2 (APC-IV conversion circuit) for converting the output current of the monitor photodiode PD into a voltage level; an optical output power control circuit 4 (i.e. control circuit for controlling optical output power) for performing control so as to eliminate the difference between the output voltage V2 of the current-to-voltage conversion circuit 2 and the LD optical output power setting voltage V1; a low-pass filter 6 (LBW-LPF) which is connected to the "output voltage V4" terminal of the optical output power control circuit 4 and decides the loop band width of the APC circuit; an LD drive circuit 8 (LD-Drv circuit, a drive circuit) for controlling the drive current DI (drive signal) of the laser diode LD; and a first optical output cutoff control circuit 10 (i.e. first control circuit for controlling optical output cutoff) capable of reducing the LD drive current of the LD drive circuit 8 to 0 mA according to external optical output cutoff signal input S.

The APC circuit further comprises: an optical output power setting input circuit 12 (i.e. an input circuit for setting optical output power) for outputting the LD optical output power setting voltage V1; a second optical output cutoff control circuit 14 (i.e. a second control circuit for controlling optical output cutoff) which is connected to the optical output power setting input circuit 12 and which outputs a voltage 11 and is capable of reducing the input voltage of the optical output power control circuit 4 to 0 V according to the optical output cutoff signal input S; a low-pass filter 16 (APC-LPF) which is connected between the second optical output cutoff control circuit 14 and the optical output power control circuit 4 and outputs a voltage V12.

The APC circuit still further comprises: an LD drive setting input circuit 18 (LD-Drv setting input circuit, a drive setting input circuit for short) (i.e. input circuit for LD drive setting) for outputting an LD drive setting voltage V3; and a low-pass filter 22 (ACC-LPF) connected between the LD drive setting input circuit 18 and the LD drive circuit 8.

Incidentally, though not shown, the LD drive circuit 8 comprises a circuit for driving the bias current of the laser diode LD and a circuit for driving the modulation current of the laser diode LD. The former circuit for driving the bias current is set by the LD drive setting voltage V3 output from the LD drive setting input circuit 18. The latter circuit for driving the modulation current of the laser diode LD is controlled by the output voltage 4 of the optical output power control circuit 4

The components described above collectively constitute the APC circuit.

Even though the current-to-voltage conversion circuit 2 (APC-IV conversion circuit) is a circuit for converting the output current of the monitor photodiode PD into a voltage level, it may have a function to output the average value of the output current of the monitor photodiode PD. Furthermore, the LD module may include both a thermistor for detecting the temperature of the laser diode LD (abbreviated as LD temperature) and a thermal electric cooler (TEC) made up of a thermoelectric conversion element, and control the temperature of the laser diode LD by use of an automatic temperature control circuit (ATC circuit).

In the above circuit configuration, if the optical output cutoff signal S is input when the APC circuit is controlling the optical output power (abbreviated as the LD optical output power) of the laser diode LD so as to keep it constant, the input voltage V12 of the optical output power control circuit 4 can be reduced to 0 V at high speed by use of the second optical output cutoff control circuit 14. Therefore, the output voltage V4 of the optical output power control circuit 4 also can be reduced to 0 V. Further, when the input of the optical output cutoff control signal S has been removed, the input voltage V12 of the optical output power control circuit 4 rises from 0 V to a set voltage slowly according to the time constant of the low-pass filter 16 and therefore the output voltage V4 (comparison signal) of the optical output power control circuit 4 also slowly rises from 0 V, producing no overshoot of the optical output. The circuit operation will be described below based on each output.

Figure 5:
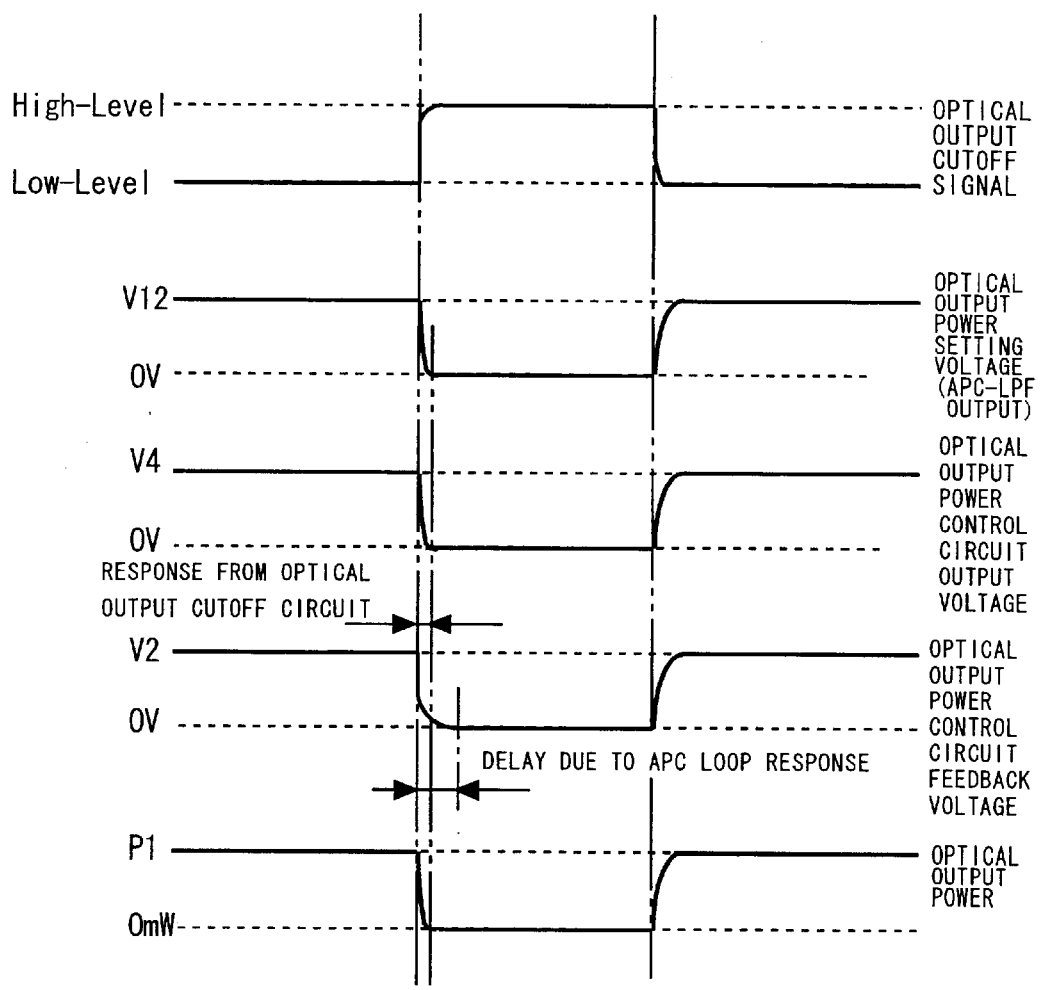
FIG. 5 shows a signal waveform diagram used to describe the operation of the APC circuit shown in FIG. 1.

FIG. 5 is a signal waveform diagram used to describe the operation of the APC circuit shown in FIG. 1.

Assume that the LD temperature is controlled by the automatic temperature control circuit ATC so as to be kept constant. Referring to FIGS. 1 and 5, reference numeral V1 denotes the LD optical output power setting voltage output from the optical output power setting input circuit 12; V11 the output voltage of the second optical output cutoff control circuit 14; V12 the output voltage of the low-pass filter 16; V2 the feedback voltage output from the current-to-voltage conversion circuit 2; and V4 the output of the optical output power control circuit 4 (i.e. comparison signal).

Consider a case in which the optical output cutoff signal S is input to both the first optical output cutoff control circuit 10 and the second optical output cutoff control circuit 14. Since the LD drive circuit 8 controls the LD drive current according to the first optical output cutoff control circuit 10 so that the LD drive current decreases to 0 mA, the LD optical output power is reduced to 0 mW immediately. At that time, the second optical output cutoff control circuit 14 immediately decreases the input voltage V12 of the optical output power control circuit 4 to 0 V. As a result, the output voltage V4 of the optical output power control circuit 4 is reduced to 0 V without occurrence of overshoot.

Then, when the optical output cutoff signal S has been removed, the first optical output cutoff control circuit 10 immediately controls the LD drive circuit 8 such that the LD drive circuit 8 can drive the current of the laser diode LD. At that time, the second optical output cutoff control circuit 14 immediately inputs the LD optical output power setting voltage V1 to the low-pass filter 16. Since the input voltage V12 of the optical output power control circuit 4 (the output voltage of the low-pass filter 16) slowly rises from 0 V to the voltage set before the cutoff, no overshoot of the optical output occurs.

As described above, the APC circuit of the first embodiment includes optical output cutoff control circuits outside its feedback loop, and reduces their setting voltages to the GND level when an optical output cutoff signal has been input. With this arrangement, it is possible to prevent overshoot of the output power of the laser diode LD when the optical output cutoff signal has been input or removed.

The configuration of the APC circuit of the first embodiment described above may be summarized as follows in one way.

The APC circuit comprises: an LD module including a laser diode LD and a monitor photodiode PD; a current-to-voltage conversion circuit 2 (APC-IV conversion circuit) for converting the output current of the monitor photodiode PD into a voltage level; an optical output power control circuit 4 for performing control so as to eliminate the difference between the output voltage V2 (feedback voltage) of the current-to-voltage conversion circuit 2 and an LD optical output power setting voltage V1; a low-pass filter 6 (LBW-LPF) for deciding the band width of the loop including the above components and circuits; an LD drive circuit 8 (LD-Drv circuit) for controlling the drive current DI of the laser diode LD; an LD optical output power setting input circuit 12; a low-pass filter 16 (APC-LPF) disposed between the LD optical output power setting input circuit 12 and the optical output power control circuit 4; an LD drive setting voltage input circuit 18 (LD-Drv circuit setting voltage input circuit); a low-pass filter 22 (ACC-LPF) disposed between the LD drive setting voltage input circuit 18 (LD-Drv circuit setting voltage input circuit) and the LD drive circuit 8 (LD-Drv circuit); and an optical output cutoff control circuit 14 between the LD optical output power setting input circuit 12 and the low-pass filter 16 (APC-LPF); wherein the APC circuit automatically controls the optical output power of the laser diode LD.

Incidentally, the first embodiment may be generalized as follows.

The laser diode LD is a light emitting device; the circuit obtained as a result of connecting the monitor photodiode PD with the current-to-voltage conversion circuit 2 may be called a monitor circuit MC; and the output voltage V2 (feedback voltage) of the monitor circuit may be called a monitor signal. With this generalization, the configuration of the optical output control circuit of the first embodiment can be described as follows.

In this optical output control circuit, a drive circuit 8 outputs a drive signal DI to the light emitting device LD so that the light emitting device LD emits light. A drive setting input circuit 18 outputs an LD drive setting signal V3 to the drive circuit 8 to keep the light emitting device LD in a constant operational state. An optical output power setting input circuit 12 outputs an optical output power setting signal V1 (LD optical output power setting voltage) to set the optical output power of the light emitting device LD. The monitor circuit MC (including the photodiode PD and the current-to-voltage conversion circuit 2) monitors the optical output power of the light emitting device LD and outputs a monitor signal V2 (feedback voltage). The optical output power control circuit 4 compares the optical output power setting signal V1 (LD optical output power setting voltage) and the monitor signal V2 (feedback signal), and thereby inputs a comparison signal V4 to the drive circuit 8 to control the drive signal of the drive circuit 8. To temporarily cut off the optical output, a first optical output cutoff control circuit 10 receives an optical output cutoff signal S for cutting off the optical output of the light emitting device LD, and causes the drive circuit 8 not to output the drive signal while the first optical output cutoff control circuit 10 is receiving the optical output cutoff signal S. The second optical output cutoff control circuit 14, on the other hand, receives the optical output cutoff signal S and changes the optical output power setting signal V1 (LD optical output power setting voltage) to be input to the optical output power control circuit 4 to an optical output cutoff level while the second optical output cutoff control circuit 14 is receiving the optical output cutoff signal S. Thus, control of the optical output power including the cutoff operation of the optical output is performed.

Furthermore, preferably in this optical output control circuit, a low-pass filter 16 is inserted between the second optical output cutoff control circuit 14 and the optical output power control circuit 4, while a low-pass filter 22 is inserted between the drive setting input circuit 18 and the drive circuit 8.

Second Embodiment

Figure 2:
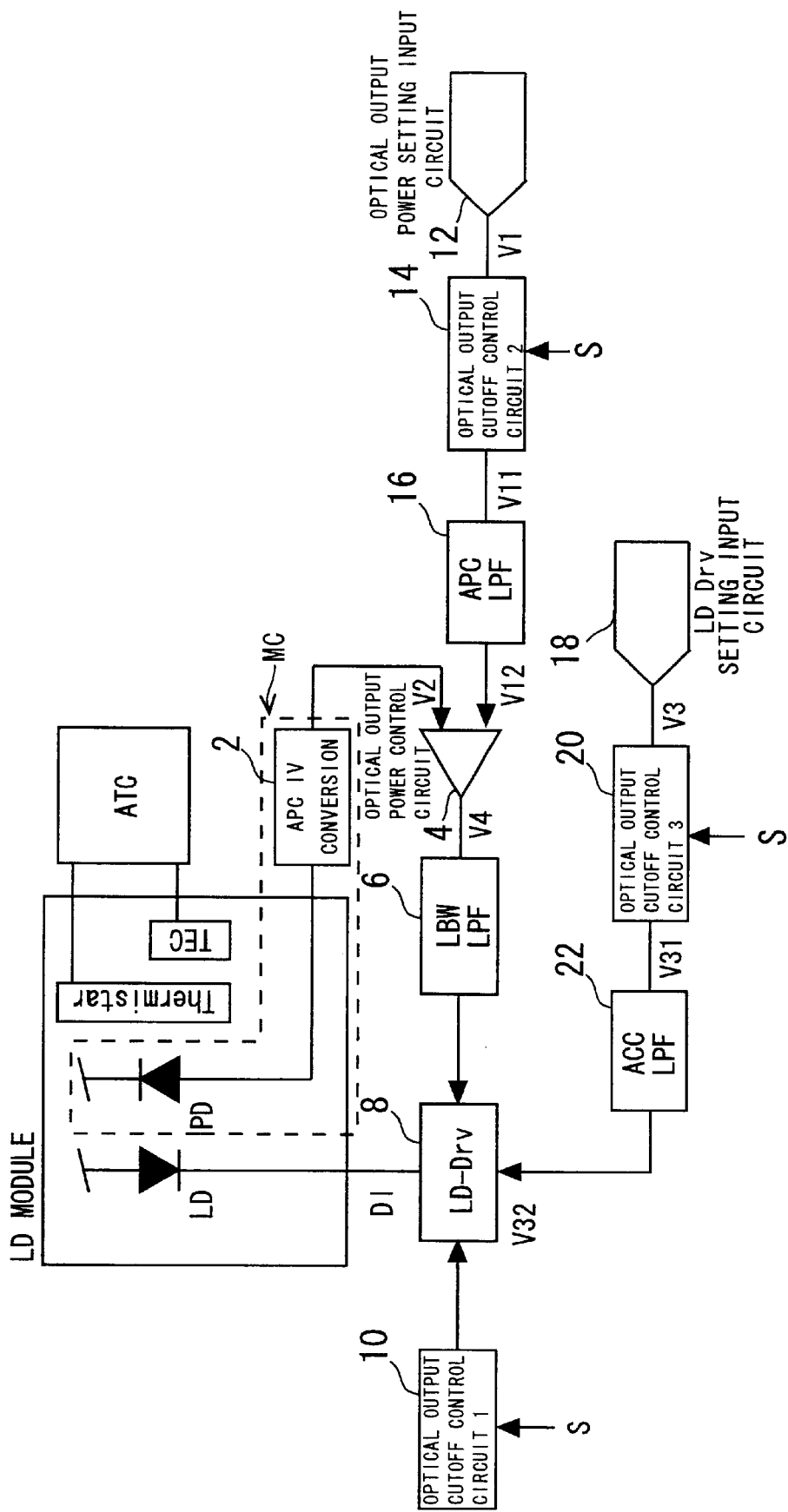
FIG. 2 is a block diagram showing the configuration of an optical output control circuit or an automatic power control circuit (APC circuit) according to a second embodiment of the present invention.

FIG. 2 is a block diagram showing the configuration of an optical output control circuit or an automatic power control circuit (APC circuit) according to a second embodiment of the present invention.

In addition to the configuration of the first embodiment, the configuration of the second embodiment includes a third optical output cutoff control circuit 20 (i.e. third control circuit for optical output cutoff) disposed between the LD drive circuit 8 and the LD drive setting input circuit 18. In the above circuit configuration, if the optical output cutoff signal S is input when the APC circuit is controlling the LD optical output power so as to keep it constant, both the input voltage V31 of the low-pass filter 22 (ACC-LPF) and the input voltage V32 of the LD drive circuit 8 can be reduced to 0 V at high speed by use of the third optical output cutoff control circuit 20. When the input of the optical output cutoff signal S has been removed, the input voltage V32 of the LD drive circuit 8 rises from 0 V to a set voltage slowly according to the time constant of the low-pass filter 22 (ACC-LPF), causing no overshoot of the LD bias current. The circuit operation will be described below based on each output.

Figure 6:
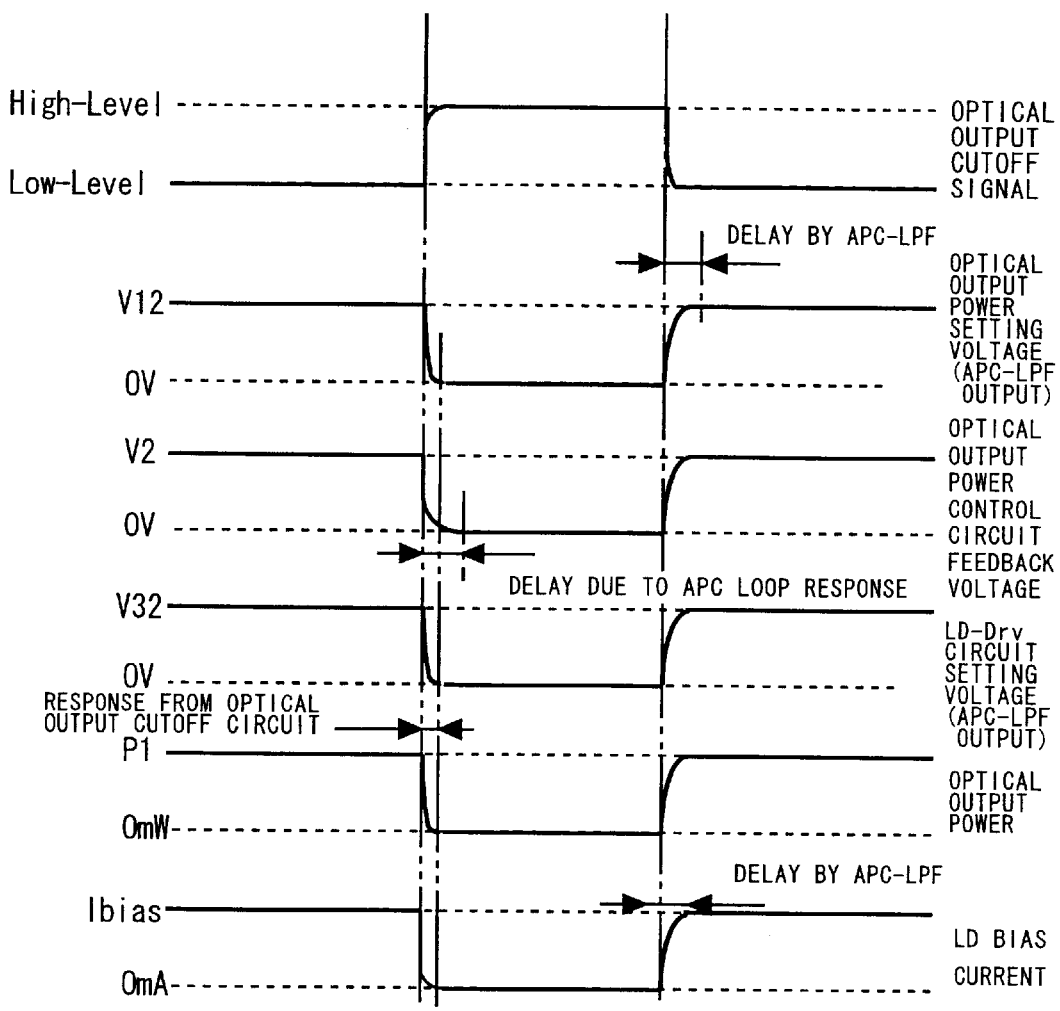
FIG. 6 shows a signal waveform diagram used to describe the operation of the APC circuit shown in FIG. 2.

FIG. 6 is a signal waveform diagram used to describe the operation of the APC circuit shown in FIG. 2.

Assume that the LD temperature is controlled by an ATC circuit so as to be kept constant. Reference numeral V1 denotes the LD optical output power setting voltage; V11 the output voltage of the second optical output cutoff control circuit 14; V12 the output voltage of the low-pass filter 16 (APC-LPF); V2 the feedback voltage output from the current-to-voltage conversion circuit 2; V3 the output voltage (LD drive setting voltage) of the LD drive setting input circuit 18; V31 the output voltage of the third optical output cutoff control circuit 20; V32 the output voltage of the low-pass filter 22 (ACC-LPF); and V4 the output from the optical output power control circuit 4. Generally, to operate the laser diode LD for an optical transmitter at high speed, the LD bias current is set to be approximately equal to the threshold current of the laser diode LD and the LD modulation current is set so as to meet the optical output power and the extinction ratio.

When the optical output cutoff signal has been input while the APC circuit is controlling the LD optical output power so as to keep it constant, the LD optical output is cut off through the sequence indicated in the first embodiment. That is, when the optical output signal has been input, the LD drive circuit 8 controls the LD drive current so as to set it at 0 mA. Therefore, the LD optical output power is immediately reduced to 0 mW, and the input voltage V12 and the output voltage V4 of the optical output power control circuit 4 also decrease to 0 V. Furthermore, the third optical output cutoff control circuit 20 disposed between the LD drive circuit 8 and the LD drive setting input circuit 18 reduces both the input voltage V31 of the low-pass filter 22 (ACC-LPF) and the LD drive setting voltage V32 to 0 V. Accordingly, in this case, the first optical output cutoff control circuit 10 for the LD drive circuit 8 may be omitted.

Then, when the input of the optical output cutoff signal S has been removed, both the input voltage V31 of the low-pass filter 22 (ACC-LPF) and the input voltage V32 of the LD drive circuit 8 are still set at 0 V as their initial value. Therefore, even if a feedback loop is formed within the LD drive circuit 8 to keep the bias current of the LD constant, the internal voltage of the LD drive circuit 8 is not fixed at the maximum output voltage. This means that since the input voltage V32 of the LD drive circuit 8 rises from 0 V to a set voltage slowly due to the action of the low-pass filter 22 (ACC-LPF), no overshoot of the LD bias current occurs.

Incidentally, the configuration of the optical output control circuit of the second embodiment can be described as follows.

This optical output control circuit includes the third optical output cutoff control circuit 20 in addition to the circuit configuration of the first embodiment. The third optical output cutoff control circuit 20 receives the optical output cutoff signal S and changes the drive setting signal V3 (LD drive setting voltage) to be input to the drive circuit 8 to the level to reset the operation state of the light emitting device LD. Thus, control of the optical output power including the cutoff operation of the optical output is performed.

Third Embodiment

Figure 3:
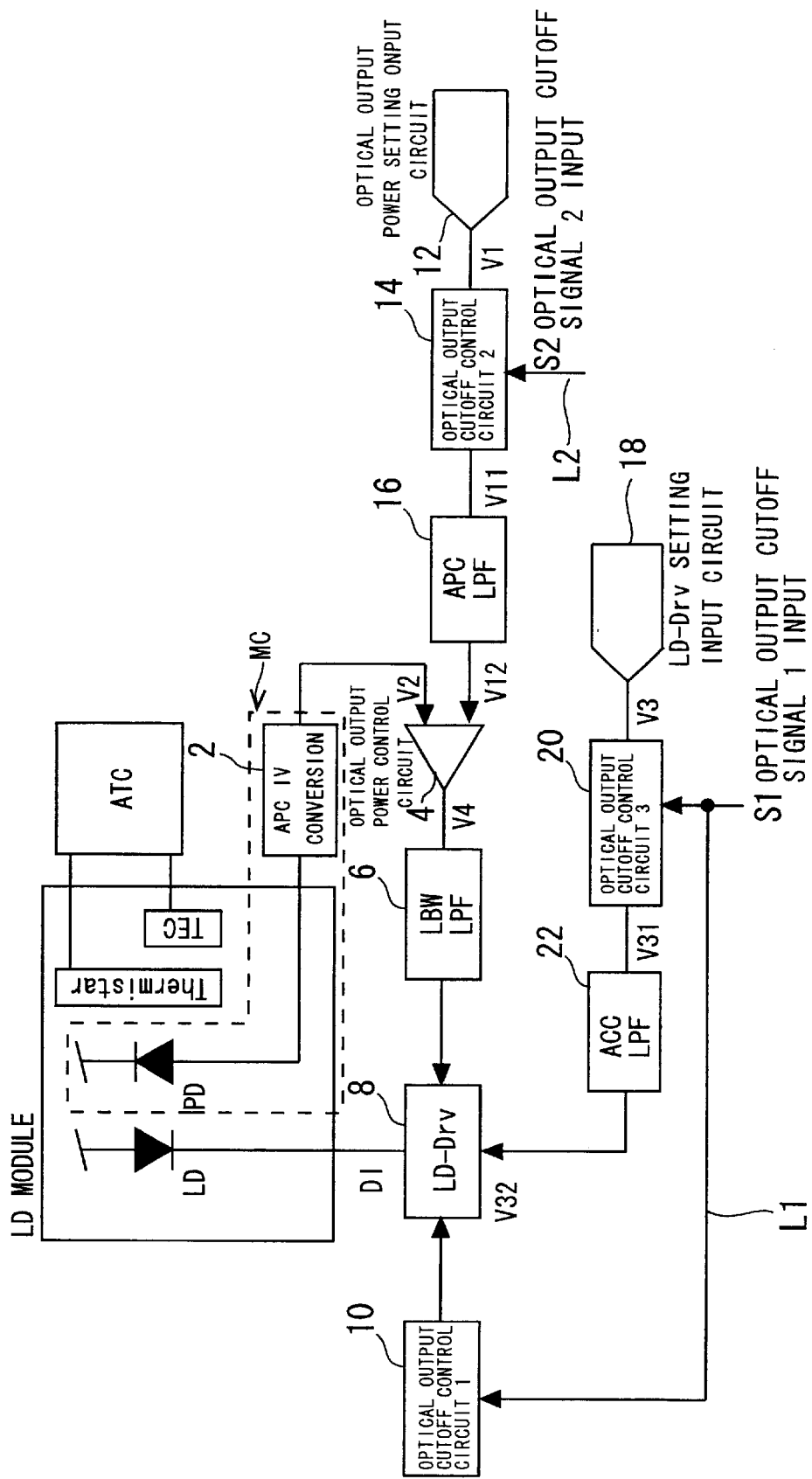
FIG. 3 is a block diagram showing the configuration of an optical output control circuit or an automatic power control circuit (APC control circuit) according to a third embodiment of the present invention.

FIG. 3 is a block diagram showing the configuration of an optical output control circuit or an automatic power control circuit (APC control circuit) according to a third embodiment of the present invention.

The configuration of the third embodiment is different from that of the second embodiment in that the third embodiment includes two optical output cutoff signal input routes. Specifically, the third embodiment includes: an input circuit L1 for inputting a first optical output cutoff signal input S1 to both the first optical output cutoff control circuit 10 and the third optical output cutoff control circuit 20 commonly; and an input circuit L2 for inputting a second optical output cutoff signal input S2 to the second optical output cutoff control circuit 14.

In the second embodiment, since the LD drive setting voltage V3 and the optical output power setting voltage V1 are input to the LD drive circuit 8 at the same time, a transient operation may occur at power-on or when the optical cutoff signal input or the LD optical output power is not at their target value. To cope with this, the time constant of the low-pass filter 16 (APC-LPF) is generally set to be larger than that of the low-pass filter 22 (ACC-LPF). However, since the time constants of the low-pass filters 22 and 16 are very large, it is difficult to provide a sufficient difference between their rising times. Therefore, when the LD bias current value is substantially equal to the LD modulation current value, the optical output signal may be output before a target optical output power value is reached.

In the circuit configuration of the third embodiment, even if the optical output cutoff signal is input or removed when the APC circuit is controlling the optical output power so as to keep it constant, no transient operation occurs in a state in which the LD optical output power is not at its target value since it is possible to arbitrarily determine the time during which the setting voltage is applied to the LD drive circuit 8. The circuit operation will be described below based on each output.

Figure 7:
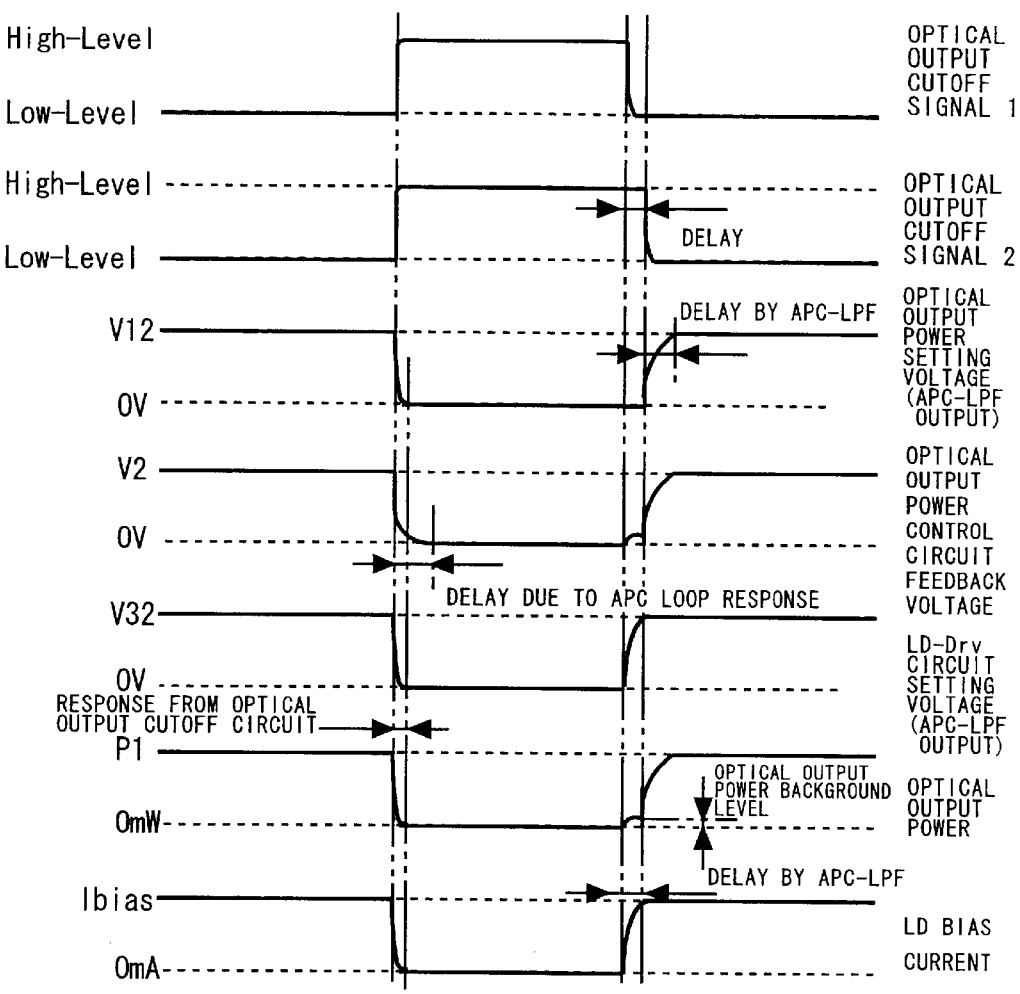
FIG. 7 shows a signal waveform diagram used to describe the operation of the APC circuit shown in FIG. 3.
Figure 8:
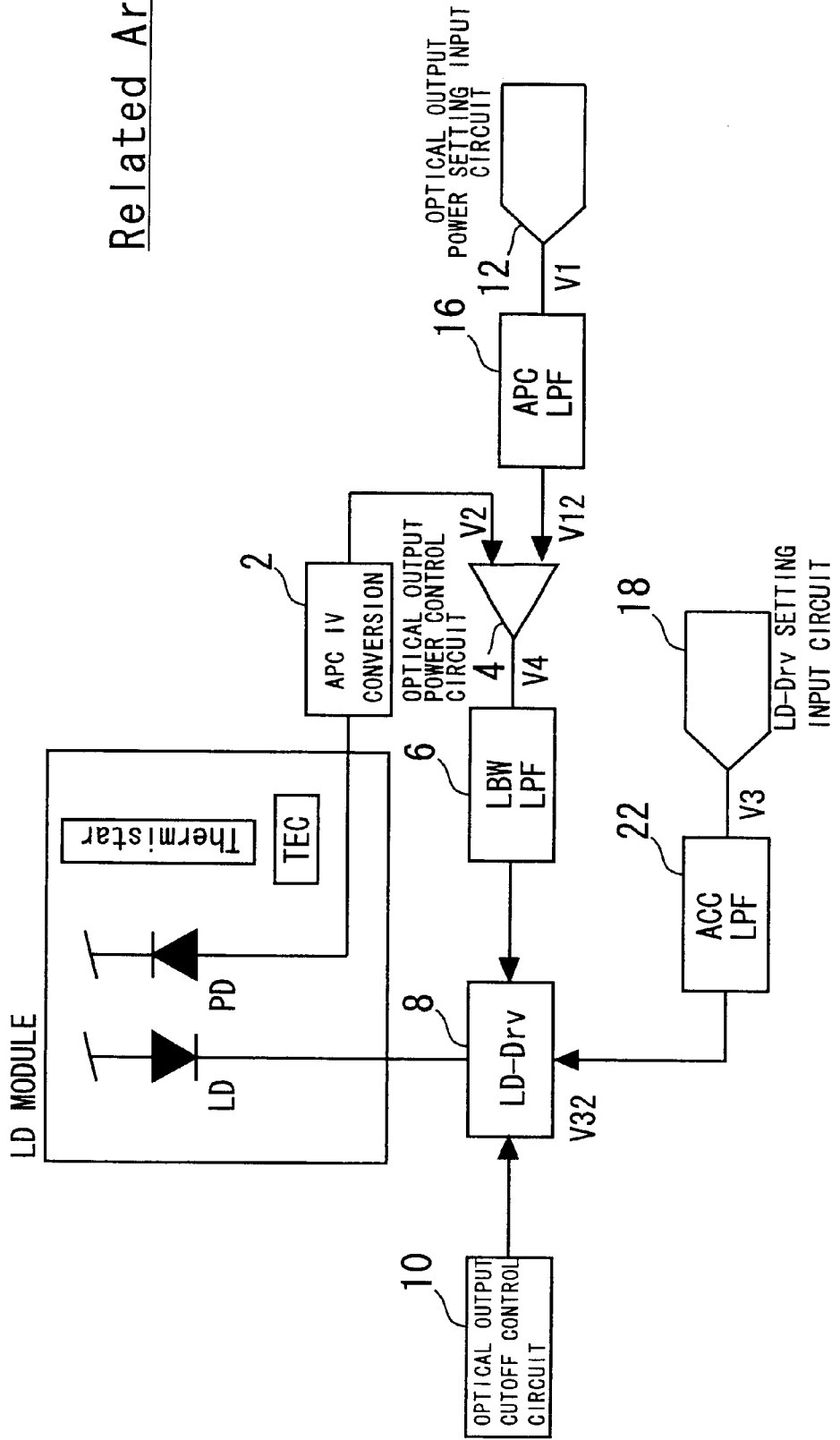
FIG. 8 shows a conventional general optical output control circuit or automatic power control circuit.
Figure 9:
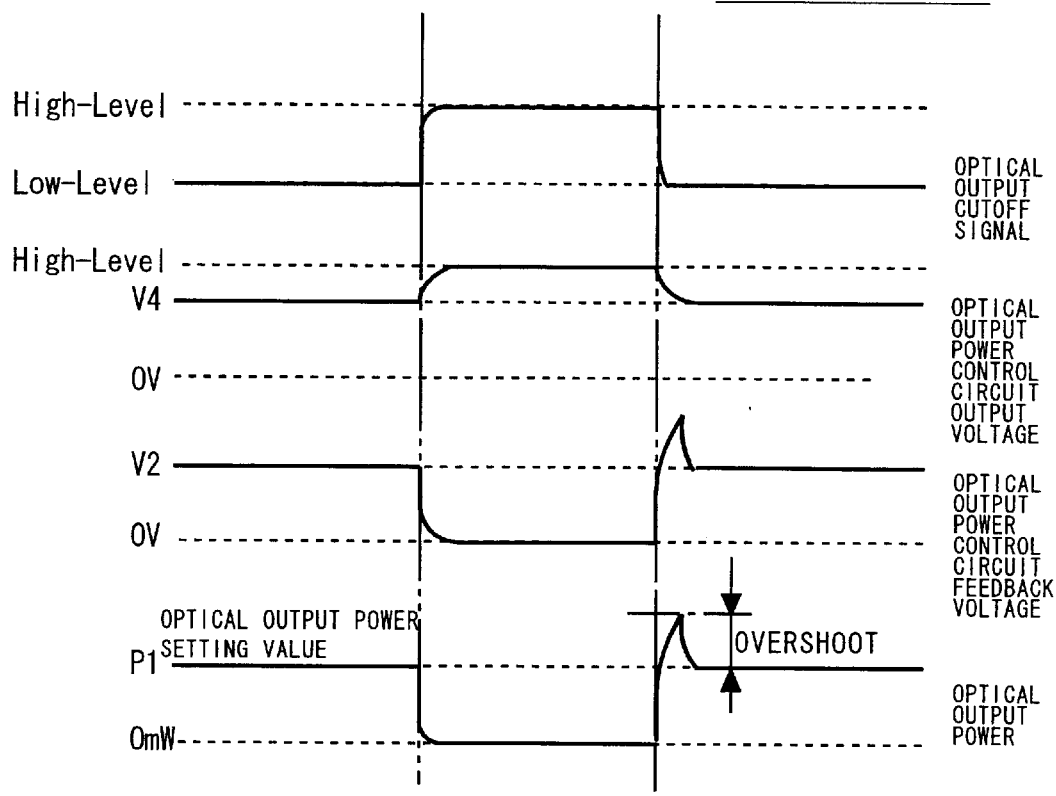
FIG. 9 shows a signal waveform diagram used to describe the operation of the APC circuit shown in FIG. 8.

FIG. 7 is a signal waveform diagram used to describe the operation of the APC circuit shown in FIG. 3.

Assume that the LD temperature is controlled by an ATC circuit so as to be kept constant. Reference numeral V1 denotes the LD optical output power setting voltage; V11 the output voltage of the second optical output cutoff control circuit 14; V12 the output voltage of the low-pass filter 16; V2 the feedback voltage output from the current-to-voltage conversion circuit 2; V3 the output voltage (LD drive setting voltage) of the LD drive setting input circuit 18; V31 the output voltage of the third optical output cutoff control circuit 20; V32 the output voltage of the low-pass filter 22; and V4 the output from the optical output power control circuit 4. It is arranged such that when the optical output cutoff signal input is at the High level, the laser diode LD is in the optical output cutoff state. When the optical output cutoff signal input is at the LOW level, on the other hand, the laser diode LD is in the operation state.

If the optical output cutoff signals S1 and S2 are simultaneously input while the APC circuit is controlling the LD optical output power so as to keep it constant, the LD optical output is cut off through the sequence indicated in the second embodiment. In this case, both the input voltage 12 of the optical output power control circuit 4 and the input voltage V32 of the LD drive circuit 8 are reduced to 0 V, reducing the LD drive current to 0 mA. Accordingly, in this case, the first optical output cutoff control circuit 10 for the LD drive circuit 8 may be omitted.

Then, to reset the optical output cutoff state, the optical output cutoff signal S1 input to the first and third optical output cutoff control circuits 10 and 20 is removed. When the optical output cutoff signal S1 has been removed, the LD drive circuit 8 drives an LD bias current corresponding to the LD drive setting voltage V3. At that time, the LD bias current is set to be approximately equal to the threshold current of the laser diode LD, providing a background level for the LD optical output. No overshoot of the LD bias current occurs due to the action of the low-pass filter 22, and therefore any noise in the LD optical output attributed to overshoot is observed.

After the LD bias current has become stable, the optical output cutoff signal S2 input to the second optical output cutoff control circuit 14 is removed. When the optical output cutoff signal S2 has been removed, the optical output power control circuit 4 outputs a control voltage corresponding to the LD optical output power setting voltage V1 to the LD drive circuit 8 which in turn drives the modulation current. No overshoot of the LD modulation current, that is, no overshoot of the optical output occurs due to the action of the low-pass filter 16. Therefore, the laser diode LD is not possibly destructed by overcurrent attributed to such overshoot. Furthermore, the LD bias current has been already set at that time, setting the background of the LD optical output. Therefore, the setting is carried out in a substantially same process as that for the transmission operation of the laser diode LD, and as a result the LD can be stably operated.

Thus, in addition to the circuit configuration of the second embodiment, the circuit configuration of this optical output control circuit includes: an input circuit L1 for inputting a first optical output cutoff signal S1 to both the first optical output cutoff control circuit 10 and the third optical output cutoff control circuit 20; and an input circuit L2 for inputting a second optical output cutoff signal S2 to the second optical output cutoff control circuit 14. Furthermore, the input timings of the first optical output cutoff control signal S1 and the second optical cutoff control signal S2 are set to be substantially equal. On the other hand, the removal timing of the second optical output cutoff control signal S2 is delayed from that of the first optical output cutoff control signal S1 by a predetermined time.

Fourth Embodiment

Figure 4:
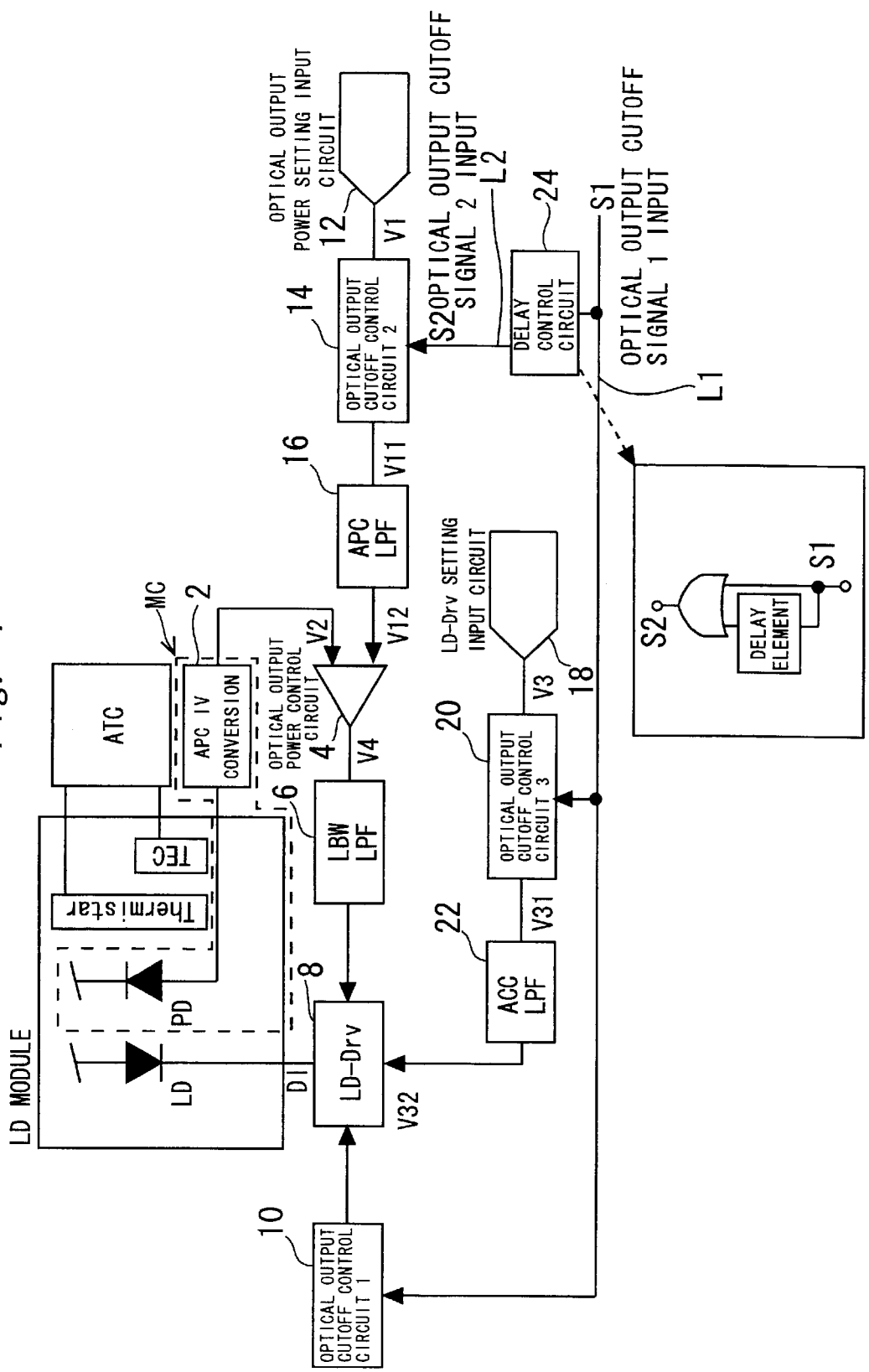
FIG. 4 is a block diagram showing the configuration of an optical output control circuit or an automatic power control circuit (APC circuit) according to a fourth embodiment of the present invention.

FIG. 4 is a block diagram showing the configuration of an optical output control circuit or an automatic power control circuit (APC circuit) according to a fourth embodiment of the present invention.

The configuration of the fourth embodiment is different from that of the third embodiment in that, of the two optical output cutoff signal input routes, one directed to the second optical output cutoff control circuit 14 is provided with a delay control circuit. Specifically, the fourth embodiment includes an input circuit L1 for inputting an optical output cutoff signal input S1 to the first optical output cutoff control circuit 10 and the third optical output cutoff control circuit 20, and an input circuit L2 branching from the input circuit L1. A delay circuit 24 is inserted into the input circuit L2 so as to delay an optical output cutoff signal input S2 to be output by a predetermined time.

In such a configuration including the delay control circuit 24, only one optical output cutoff signal input is required. The circuit operation will be described below.

FIG. 7 is a signal waveform diagram used to describe the operation of the APC circuit shown in FIG. 4.

Assume that the LD temperature is controlled by an ATC circuit so as to be kept constant. Reference numeral V1 denotes the LD optical output power setting voltage; V11 the output voltage of the second optical output cutoff control circuit 14; V12 the output voltage of the low-pass filter 16 (APC-LPF); V2 the feedback voltage output from the current-to-voltage conversion circuit 2; V3 the output voltage (LD drive setting voltage) of the LD drive setting input circuit 18; V31 the output voltage of the third optical output cutoff control circuit 20; V32 the output voltage of the low-pass filter 22 (ACC-LPF); and V4 the output from the optical output power control circuit 4. It is arranged such that when the optical output cutoff signal input is at the High level, the laser diode LD is in the optical output cutoff state. When the optical output cutoff signal input is at the Low level, on the other hand, the laser diode LD is in the operation state.

If a High level signal is input to the input circuit L1 as the optical output cutoff signal S1 while the APC circuit is controlling the LD optical output power so as to keep it constant, the LD optical output is cut off through the sequence indicated in the third embodiment. Since the delay circuit 24 is made up of a delay element and an OR gate, the optical output cutoff signal inputs S1 and S2 are equal to each other. In this case, the inputs voltages of the optical output power control circuit 4 and the LD drive circuit 8 are reduced to 0 V, setting the LD drive current at 0 mA. With this arrangement, it is possible to omit the first optical output cutoff control circuit 10 for the LD drive circuit 8.

Then, to reset the optical output cutoff state, a Low level signal is input as the optical output cutoff signal S1. As a result, the LD drive circuit 8 drives an LD bias current corresponding to the LD drive setting voltage V3. At that time, the LD bias current is set to be approximately equal to the threshold current of the laser diode LD, providing a background level for the LD optical output. No overshoot of the LD bias current occurs due to the action of the low-pass filter 22, and therefore any noise in the LD optical output attributed to overshoot is observed.

The delay element in the delay control circuit 24 delays the input signal until the LD bias current has become stable. An RC filter, a counter, etc. can be used as the delay element if it is capable of providing a delay. The circuit operation proceeds as follows. The optical output cutoff signal S2 decreases to the Low level after the delay time produced by the delay element has elapsed; the optical output power control circuit 4 outputs a control voltage corresponding to the LD optical output power setting voltage V1 to the LD drive circuit 8; and the LD drive circuit 8 drives the LD modulation current. No overshoot of the LD modulation current, that is, no overshoot of the optical output occurs due to the action of the low-pass filter 16. Therefore, the laser diode LD is not possibly destructed by overcurrent attributed to overshoot. Furthermore, the LD bias current has been already set at that time, setting the background of the LD optical output. Therefore, the setting is carried out in a substantially same process as that for the transmission operation of the LD, and as a result the LD can be stably operated.

According to the present embodiment, it is arranged such that: when the optical output cutoff signal input is at the High level, the laser diode LD is in the optical output cutoff state; and when the optical output cutoff signal input is at the Low level, the laser diode LD is in the operation state. The above relationships may be reversed by using a delay circuit made up of a delay element and an AND gate, providing the same operation as that described above.

Incidentally, the configuration of the optical output control circuit of the fourth embodiment can be described as follows.

In addition to the circuit configuration of the second embodiment, the circuit configuration of this optical output control circuit includes an input circuit L1 for inputting the optical output cutoff signal S1 to the first optical output cutoff control circuit 10 and the third optical output cutoff control circuit 20, and an input circuit L2 branching from the input circuit L1. The optical output cutoff signal S2 delayed by a predetermined time is input to the second optical output cutoff control circuit 14 through the delay circuit 24.

As described above, the first optical output cutoff control circuit 10 may be omitted from FIGS. 2 to 4 which show the second to fourth embodiments. In this case, the third optical output cutoff control circuit 20 may be called one optical output cutoff control circuit, while the second optical output cutoff control circuit 14 is called the other optical output cutoff control circuit. Then, the configurations of the optical output control circuits according to the second to fourth embodiments can be described as follows.

In this optical output control circuit, a drive circuit 8 outputs a drive signal to a light emitting device LD so that the light emitting device LD emits light. A drive setting input circuit 18 outputs a drive setting signal V3 (LD drive setting voltage) to the drive circuit 8 to keep the light emitting device LD in a constant operational state. An optical output power setting circuit 12 outputs an optical power setting signal V1 (LD optical output power setting voltage) to set the optical output power of the light emitting device LD. A monitor circuit (PD, 2) monitors the optical output power of the light emitting device LD and outputs a monitor signal V2 (feedback voltage). The optical output power control circuit 4 compares the optical output power setting signal V1 (LD optical output power voltage) and the monitor signal V2 (feedback voltage), and thereby inputs a comparison signal V4 to the drive circuit 8 to control the drive signal of the drive circuit 8. To temporarily cut off the optical output, the optical output cutoff control circuit 20 (one optical output cutoff control circuit) receives an optical output cutoff control signal S or S1 for cutting off the optical output of the light emitting device LD, and changes the drive setting signal V3 (LD drive setting voltage) to be input to the drive circuit 8 to the level to reset the operation state of the light emitting device LD while the optical output cutoff control circuit 20 is receiving the optical output cutoff signal. The other optical output cutoff control circuit 14, on the other hand, receives an optical output cutoff signal S or S2 and changes the optical output power setting signal V1 (LD optical output power setting voltage) to be input to the optical output power control circuit 4 to an optical output cutoff level while the other optical output cutoff control circuit 14 is receiving the optical output cutoff signal. Thus, control of the optical output power including the cutoff operation of the optical output is performed.

It should be noted that the first optical output cutoff control circuit 10 may be omitted from the first embodiment shown in FIG. 1 since the second optical output cutoff control circuit 14 can be used to set the setting voltage of the APC circuit to the GND level when the optical output cutoff signal has been input. With this arrangement, it is possible to prevent overshoot of the output power of the laser diode LD when the optical output cutoff signal is input or removed. Since the operation of the circuit can be understood from the above description, no further explanation will be provided.

It should be noted that the prevent invention is described as applied to an optical output control circuit or an automatic power control circuit in the above descriptions. However, the present invention may be regarded as a light emitting device or an optical transmission device which includes an optical output control circuit and is used in an optical communications system, etc.

As described above in the respective embodiments, the optical output control circuit according to the present invention includes an optical output cutoff control circuit outside its feedback loop, making it possible to prevent overshoot of the optical output when the optical output cutoff signal is input or removed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-077172, filed on Mar. 16, 2001 including specification, claims, drawings and summary, on which the Convention priority of the present application is based, are incorporated herein by reference in its entirety.

What is claimed is:

1. An optical output control circuit comprising:

a light emitting device;

a drive circuit for outputting a drive signal to said light emitting device so that said light emitting device emits light;

a drive setting input circuit for outputting to said drive circuit a drive setting signal to keep said light emitting device in a constant state;

an optical output power setting input circuit for outputting an optical output power setting signal to set optical output power of said light emitting device;

a monitor circuit for monitoring said optical output power of said light emitting device, and outputting a monitor signal;

an optical output power control circuit for comparing said optical output power setting signal with said monitor signal, and outputting a comparison signal to said drive circuit to control said drive signal of said drive circuit;

a first optical output cutoff control circuit for receiving an optical output cutoff signal for cutting off optical output of said light emitting device, and stopping said drive circuit from outputting said drive signal while said optical output cutoff signal is being input; and a second optical output cutoff control circuit for receiving said optical output cutoff signal, and changing said optical output power setting signal, being input to said optical output power control circuit, to an optical output cutoff level while said optical output cutoff signal is being input;

wherein said optical output power of said light emitting device is controlled.

2. The optical output control circuit as claimed in claim 1, wherein a low-pass filter is connected between said second optical output cutoff control circuit and said optical output power control circuit.

3. The optical output control circuit as claimed in claim 1, wherein another low-pass filter is connected between said drive setting input circuit and said drive circuit.

4. The optical output control circuit as claimed in claim 1, further comprising:

a third optical output cutoff control circuit for receiving said optical output cutoff signal, and changing said drive setting signal, being input to said drive circuit, to a level to reset an operation state of said light emitting device while said optical output cutoff signal is being input.

5. The optical output control circuit as claimed in claim 4, further comprising:

an input circuit for inputting a first optical output cutoff signal to both said first and third optical output cutoff control circuits; and another input circuit for inputting a second optical output cutoff signal to said second optical output cutoff control circuit.

6. The optical output control circuit as claimed in claim 5, wherein input timings of said first optical output cutoff signal and said second optical output cutoff signal are set to be substantially equal to each other, and a removal timing of said second optical output cutoff signal is delayed from a removal timing of said first optical output cutoff signal by a predetermined time.

7. The optical output control circuit as claimed in claim 4, further comprising:

a first input circuit for inputting said optical output cutoff signal to both said first and third optical output cutoff control circuits; and a second input circuit for inputting said optical output cutoff signal to said second optical output cutoff control circuit, said second input circuit being connected to said first input circuit through a delay control circuit.

8. An optical output control circuit comprising:

a light emitting device;

a drive circuit for outputting a drive signal to said light emitting device so that said light emitting device emits light;

a drive setting input circuit for outputting to said drive circuit a drive setting signal to keep said light emitting device in a constant state;

an optical output power setting input circuit for outputting an optical output power setting signal to set optical output power of said light emitting device;

a monitor circuit for monitoring said optical output power of said light emitting device, and outputting a monitor signal;

an optical output power control circuit for comparing said optical output power setting signal with said monitor signal, and outputting a comparison signal to said drive circuit to control said drive signal of said drive circuit;

one optical output cutoff control circuit for receiving an optical output cutoff signal for cutting off optical output of said light emitting device, and changing said drive setting signal, being input to said drive circuit, to a level to reset an operation state of said light emitting device while said optical output cutoff signal is being input; and another optical output cutoff control circuit for receiving said optical output cutoff signal, and changing said optical output power setting signal, being input to said optical output power control circuit, to an optical output cutoff level while said optical output cutoff signal is being input;

wherein said optical output power of said light emitting device is controlled.

9. The optical output control circuit as claimed in claim 8, wherein a low-pass filter is connected between said one optical output cutoff control circuit and said drive circuit.

10. The optical output control circuit as claimed in claim 8, wherein another low-pass filter is connected between said another optical output cutoff control circuit and said optical output power control circuit.

11. The optical output control circuit as claimed in claim 8, further comprising:

an input circuit for inputting a first optical output cutoff signal to said one optical output cutoff control circuit; and another input circuit for inputting a second optical output cutoff signal to said another optical output cutoff control circuit.

12. The optical output control circuit as claimed in claim 11, wherein input timings of said first optical output cutoff signal and said second optical output cutoff signal are set to be substantially equal to each other, and a removal timing of said second optical output cutoff signal is delayed from a removal timing of said first optical output cutoff signal by a predetermined time.

13. The optical output control circuit as claimed in claim 8, further comprising:

a first input circuit for inputting said optical output cutoff signal to said one optical output cutoff control circuit; and a second input circuit for inputting said optical output cutoff signal to said another optical output cutoff control circuit, said second input circuit being connected to said first input circuit through a delay control circuit.

14. An optical output control circuit comprising:

a light emitting device;

a drive circuit for outputting a drive signal to said light emitting device so that said light emitting device emits light;

a drive setting input circuit for outputting to said drive circuit a drive setting signal to keep said light emitting device in a constant state;

an optical output power setting input circuit for outputting an optical output power setting signal to set optical output power of said light emitting device;

a monitor circuit for monitoring said optical output power of said light emitting device, and outputting a monitor signal;

an optical output power control circuit for comparing said optical output power setting signal with said monitor signal, and inputting a comparison signal to said drive circuit to control said drive signal of said drive circuit; and an optical output cutoff control circuit for receiving an optical output cutoff signal for cutting off optical output of said light emitting device, and changing said optical output power setting signal, being input to said optical output power control circuit, to an optical output cutoff level while said optical output cutoff signal is being input;

wherein said optical output power of said light emitting device is controlled.

15. The optical output control circuit as claimed in claim 14, wherein a low-pass filter is connected between said optical output cutoff control circuit and said optical output power control circuit.

16. The optical output control circuit as claimed in claim 14, wherein another low-pass filter is connected between said drive setting input circuit and said drive circuit.

* * * * *